(12) United States Patent
Lim et al.

(10) Patent No.: US 7,710,756 B2
(45) Date of Patent: May 4, 2010

(54) SEMICONDUCTOR DEVICE USING MAGNETIC DOMAIN WALL MOVING

(75) Inventors: Chee-kheng Lim, Yongin-si (KR); Yong-su Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 142 days.

(21) Appl. No.: 11/655,927

(22) Filed: Jan. 22, 2007

(65) Prior Publication Data

US 2008/0025060 A1    Jan. 31, 2008

(30) Foreign Application Priority Data

Jul. 25, 2006    (KR) .................. 10-2006-0069495

(51) Int. Cl.
*G11C 19/00*    (2006.01)

(52) U.S. Cl. .................. 365/81; 365/158; 365/171; 365/225.5; 977/933

(58) Field of Classification Search .......... 365/171, 365/173, 158, 48, 66, 78, 80–93, 100, 130, 365/131, 148; 257/421, E21.665, 40; 438/3; 977/934–935

See application file for complete search history.

(56) References Cited

U.S. PATENT DOCUMENTS 6,834,005 B1    12/2004    Parkin

2005/0094427 A1*    5/2005    Parkin .................. 365/80
2006/0120132 A1    6/2006    Parkin

FOREIGN PATENT DOCUMENTS

KR    10-2006-0013476    10/2006

OTHER PUBLICATIONS

Spin Angular Momentum Transfer in Current-Perpendicular Nanomagnetic Junctions, Sun, IBM Journal of Research and Development, vol. 50, No. 1, Jan. 15, 2006, pp. 81-100.*
Current-Induced Domain-Wall Switching in a Ferromagnetic Semiconductor Structure, Yamanouchi, et al., Nature, vol. 428, Apr. 2004, pp. 539-542.*
Chinese Office Action and English translation dated Jul. 24, 2009.

* cited by examiner

*Primary Examiner*—Richard Elms
*Assistant Examiner*—Harry W Byrne
(74) *Attorney, Agent, or Firm*—Harness, Dickey & Pierce, P.L.C.

(57) ABSTRACT

A semiconductor device includes a magnetic wire having a plurality of magnetic domains, wherein the magnetic wire comprises a magnetic domain wall that is moved by either a pulse field or a pulse current. The magnetic wire of the semiconductor device does not require an additional notch since the magnetic wire includes a magnetic domain wall, the moving distance of which is controlled by a pulse field or a pulse current.

20 Claims, 5 Drawing Sheets

SEMICONDUCTOR DEVICE USING MAGNETIC DOMAIN WALL MOVING

CROSS-REFERENCE TO RELATED PATENT APPLICATION

This application claims the benefit of Korean Patent Application No. 10-2006-0069495, filed on Jul. 25, 2006, in the Korean Intellectual Property Office, the disclosure of which is incorporated herein in its entirety by reference.

BACKGROUND OF THE INVENTION

1. Field of the Invention

The present invention relates to a semiconductor device, and more particularly, to a semiconductor device to which magnetic domain wall movement is applied.

2. Description of the Related Art

Data storing devices are divided, for the most part, into volatile data storing devices that lose all recorded data when power is turned off and non-volatile data storing devices that keep data even when power is turned off.

Non-volatile data storing devices include a hard disc drive (HDD) and a non-volatile random access memory (RAM). The HDD includes a read and write head and a rotating data recording medium, and can store data of 100 gigabites or more. However, a device that has a rotating part like the HDD wears down over time, and thus, there is a high possibility of failure, thereby reducing reliability.

A flash memory which is widely used is an example of non-volatile RAM. However, the flash memory has the drawbacks of having slow reading and writing speeds and having a short life span. Due to the drawbacks of the flash memory, new memory devices such as ferroelectric random access memory (FRAM), magnetic random access memory (MRAM), and phase change random access memory (PRAM) have been developed in limited numbers and a few have been commercialized. However, it is difficult to develop the FRAM in the form of a large capacity memory due to the difficulty in reducing a cell area, and it is also difficult to develop the MRAM in the form of a large capacity memory since the MRAM has a large writing current and has a small sensing margin for distinguishing data signals. The PRAM is relatively easier to reduce to a minute size compared to the FRAM and MRAM, but a reduction of reset current is needed to reduce power consumption. Also, the flash memory, FRAM, MRAM, and PRAM all have small storage capacities when compared to a HDD and have high manufacturing costs.

Therefore, as a method of solving the drawbacks of the conventional non-volatile data storing devices as described above, much research and development with respect to a new data storing device that uses a magnetic domain wall movement has been carried out.

A magnetic domain in a magnetic substance and magnetic domain walls will now be described. Afterwards, a storing device that uses the magnetic domain and the magnetic domain walls will be described.

A minute magnetic region that constitutes a ferromagnetic body is named a magnetic domain. The rotation of electrons in a magnetic domain or the direction of magnetic moment is identical. The size and magnetization direction of a magnetic domain can be appropriately controlled by the shape and size of a magnetic substance and external energy.

A magnetic domain wall is a boundary portion of a magnetic domain having a magnetization direction different from another magnetic domain. The magnetic domain wall can be moved by an external magnetic field or by a current applied to a magnetic substance. A plurality of magnetic domains having a specific magnetization direction can be formed in a magnetic wire having a predetermined width and thickness, and the magnetic domains can be moved using a magnetic field or an electrical current having an appropriate intensity.

The principle of the magnetic domain wall movement can be applied to data storing devices such as HDD's. That is, an operation of reading/writing data is possible when the magnetic domains magnetized so as to correspond to specific data in a magnetic substance are moved in order to pass through a read/write head. In this case, a reading/writing operation is possible without directly rotating a recording medium. Accordingly, the problems of wearing down and failure of a conventional HDD can be solved. An example of a data storing device to which the principle of magnetic domain wall movement is applied has been disclosed in U.S. Pat. No. 6,834,005 B1.

Also, the principle of magnetic domain wall movement can be applied to a memory such as a non-volatile RAM. A non-volatile memory device that can write/read data of '0' or '1' whereby a voltage in a magnetic substance varies according to the movement of magnetic domain walls in the magnetic substance having magnetic domains magnetized in a specific direction and magnetic domain walls. In this way, since data can be read and written by varying the positions of the magnetic domain walls by flowing a specific electrical current in a line type magnetic substance, a highly integrated device having a simple structure can be realized. Therefore, when the magnetic domain wall movement is used, the manufacture of a memory having a very large storage capacity compared to the conventional FRAM, MRAM, and PRAM is possible. An example of applying the principle of magnetic domain wall movement to a memory like RAM has been disclosed in Korean Patent Publication No. 10-2006-0013476.

However, the development of semiconductor devices that use the magnetic domain wall movement is still in its initial stages, and there are a few problems that have yet to be solved in order for them to be used in practice.

In order to ensure the stability of movement of the magnetic domain walls, an artificial notch is generally used. FIG. 1 is a perspective view illustrating a conventional U shaped magnetic wire 100, which has been disclosed in U.S. Pat. No. 6,834,005 B1. Reference numerals 10 and 15 in FIG. 1 respectively indicate a magnetic domain corresponding to 1 bit and a magnetic domain wall. FIG. 2 is a plan view illustrating a conventional magnetic wire 200 having notches, which has been disclosed in Korean Patent Publication No. 10-2006-0013476. Reference numerals 20 and 25 respectively indicate a magnetic domain and a magnetic domain wall. As depicted in FIGS. 1 and 2, the notches are grooves formed on both sides of the magnetic wires 100 and 200 corresponding to portions where the magnetic domain walls will be formed, and function to stably stop the moving magnetic domain walls.

However, the formation of notches having a minute size on a magnetic wire having a thickness and width of a few tens of nanometers is practically very difficult. Furthermore, the formation of minute notches having a uniform gap, size, and shape is even more difficult. If the gap, size, and shape of the notches are not uniform, the characteristics of a device are non-uniform since the intensity of a pinning magnetic field that stops the magnetic domain wall movement varies according to the gap, size, and shape of the notches.

Therefore, the use of notches to stabilize the movement of the magnetic domain walls is inappropriate in view of process readiness and the uniformity of device characteristics. Therefore, there is a need to develop a technique that can stably move magnetic domain walls in 1 bit units without using the notches.

SUMMARY OF THE INVENTION

The present invention provides a semiconductor device that has stability in terms of the movement of magnetic domain walls without notches.

According to an aspect of the present invention, there is provided a semiconductor device that comprises a magnetic wire having a plurality of magnetic domains, wherein the magnetic wire comprises a magnetic domain wall that is moved by one of a pulse field and a pulse current, and is a notch-free magnetic wire.

The pulse field may have an intensity as strong as the intensity of a continuous field that periodically oscillates and moves the magnetic domain wall from, for example, 15 to 200 Oe (Oersted).

The pulse field may have an 'ON' time corresponding to 40 to 80% of the magnetic domain wall oscillation period.

The pulse current may have an intensity as much as the intensity of a continuous current that periodically oscillates and moves the magnetic domain wall from, for example, $1.5 \times 10^7$ to $2.0 \times 10^{10}$ A/cm.

The pulse current may have an 'ON' time corresponding to 40 to 80% of the magnetic domain wall oscillation period.

The magnetic wire may have a width of 5 to 100 nm.

The magnetic wire may have a thickness of 5 to 50 nm.

The magnetic wire may have a damping constant of 0.001 to 0.1.

The magnetic wire may be formed of one selected from the group consisting of Ni—Fe, Co, Co—Ni, Co—Fe, and Co—Fe—Ni.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE EXEMPLARY EMBODIMENTS OF THE INVENTION

A semiconductor device to which magnetic domain wall movement is applied according to an exemplary embodiment of the present invention will now be described more fully with reference to the accompanying drawings.

An aspect of the present invention, which will be described in detail, is a semiconductor device that includes a magnetic wire having a plurality of magnetic domains where the magnetic wire does not have any notches and includes magnetic domain walls that can be moved by one of a pulse field and a pulse current. The principle of using a notch free magnetic wire by using a pulse field or a pulse current will now be described.

To investigate the moving phenomenon of magnetic domain walls within a magnetic field, the following experiments were conducted.

Figure 3:
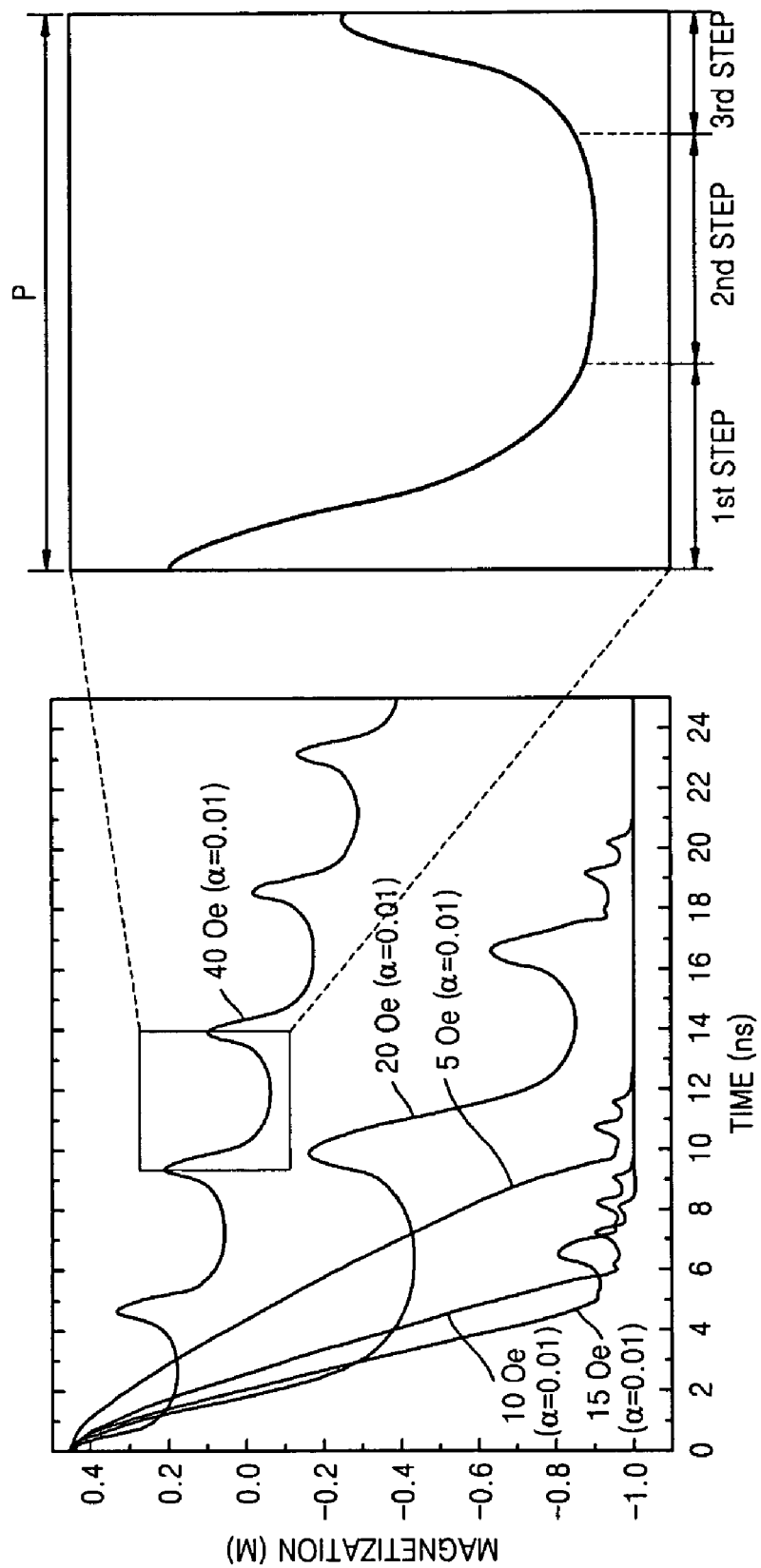
FIG. 3 is a magnetization-time (M-T) graph showing magnetization characteristics of magnetic substance samples having identical damping constants according to the intensity of a magnetic field.

The movement phenomenon of magnetic domain walls in five magnetic substance samples having an identical damping constant and each having two magnetic domains in different directions from each other were examined by applying magnetic fields that were different from each other. The results are shown in FIG. 3. FIG. 3 is a magnetization-time (M-T) graph showing magnetization characteristics of magnetic substance samples having identical damping constants, according to the intensity of a magnetic field. At this time, each of the magnetic substance samples is a bar type, and includes two magnetic domains directed in opposite directions from each other along a longitudinal direction of the bar, and the damping constant α of the samples was 0.01. The magnetic field applied to the samples was a continuous field, and was applied in one of the longitudinal directions of the bar with an intensity of 5, 10, 15, 20, and 40 oersted (Oe). Here, the damping constant α is a constant relating to the degree of distribution of energy applied to the magnetic substance, and it is indicated as α in the Landau-Lifshitz-Gilbert equation (Equation 1) given below.

$$\frac{dM}{dt} = -|\gamma|(M \times H_{\mathit{eff}}) + \frac{\alpha}{M_s}\left(M \times \frac{dM}{dt}\right) \qquad \text{[Equation 1]}$$

In Equation 1, M indicates magnetization, which is a magnetic moment per unit volume, γ indicates a gyromagnetic ratio, $H_{\mathit{eff}}$ indicates an effective field applied to the samples, and $M_s$ indicates saturation magnetization.

Referring to FIG. 3, when the applied magnetic field is approximately from 5 Oe to 15 Oe, a magnetic moment value (magnetization: M) per unit volume tends to fall from near 0.5 to −1.0 in a straight line. However, when the applied field increases to 20 Oe or more, the magnetic moment value M per unit volume tends to decrease while oscillating. In particular, when the applied field increases to approximately 40 Oe, the M-T curve tends to oscillate almost regularly.

Figure 4:
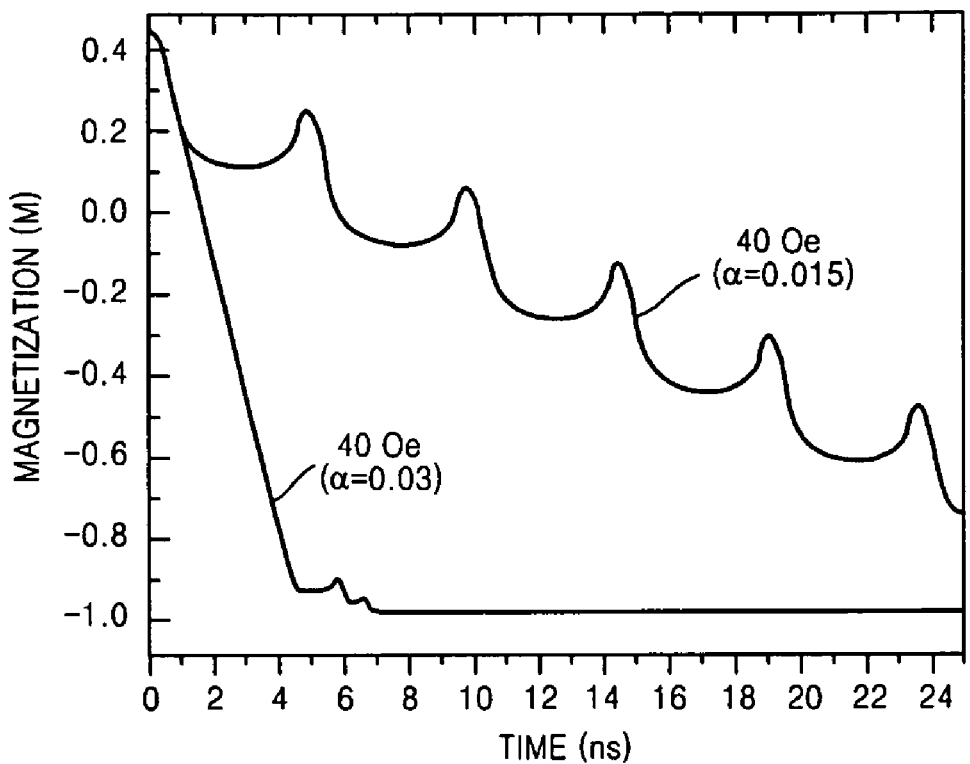
FIG. 4 is an M-T graph showing magnetization characteristics of magnetic substance samples having damping constants that are different from each other.

Also, the movement phenomenon of the magnetic domain walls of two magnetic substance samples having damping constants α that are different from each other was examined by applying magnetic fields of identical intensity. The results are shown in FIG. 4. FIG. 4 is an M-T graph showing magnetization characteristics of magnetic substance samples having damping constants that are different from each other. At this time, each of the two magnetic substance samples is a bar type and includes two magnetic domains magnetized in opposite directions from each other along a longitudinal direction of the bar, and have damping constants α of 0.015 and 0.03, respectively. The magnetic field applied to the magnetic substance samples is a continuous magnetic field, and is applied to the samples in one of the longitudinal directions of the bar with an intensity of 40 Oe.

Referring to FIG. 4, in the sample having a damping constant α of 0.03, the magnetic moment value M per unit volume tends to decrease from around 0.5 to −1.0 in a straight line, but in the other sample having a damping constant α of 0.015, the magnetic moment value M per unit volume decreases with regular oscillation in the same 40 Oe condition.

From FIGS. 3 and 4, it is determined that the M-T curve tends to periodically oscillate according to the intensity of the applied magnetic field and the size of the damping constant α. The periodic oscillation of the M-T curve shows that the magnetic domain walls move with periodic oscillation under a specific condition.

Referring to an enlarged view of FIG. 3, the periodic oscillation of the magnetic domain wall is a repetition of a first step in which the magnetic moment value M per unit volume decreases, a second step in which the magnetic moment value M per unit volume maintains a certain level, and a third step in which the magnetic moment value M per unit volume increases. The first step is a step in which the magnetic domain wall moves in a direction of the magnetic field, the second step is a step in which the magnetic domain wall does not move, and the third step is a step in which the magnetic domain wall moves in an opposite direction to the magnetic field.

Reference mark P indicates an oscillation period of the magnetic domain wall for repeating one round of the three steps, and the magnetic domain wall oscillation period P can vary according to the applied magnetic field, the damping constant α, and the substance used to form the magnetic wire. For example, the magnetic domain wall oscillation period P of $Ni_xFe_y$ having a damping constant α of 0.01 can be determined according to Equation 2.

$$P=10.3-(0.2 \times m) \quad \text{[Equation 2]}$$

Here, the unit of P is ns, and m indicates the intensity of the applied magnetic field in unit oersted.

Accordingly, magnetic domain walls of a magnetic wire can move by repeating the above first through third steps under a specific condition.

In an exemplary embodiment of the present invention, the oscillation moving phenomenon of the magnetic domain wall is used for ensuring the stability of magnetic domain wall moving. More specifically, in the present invention, the magnetic domain wall is allowed to stably stop moving by applying a pulse field (or a pulse current) that is in the off-state in the second step when the magnetic domain wall stops moving.

Figure 1:
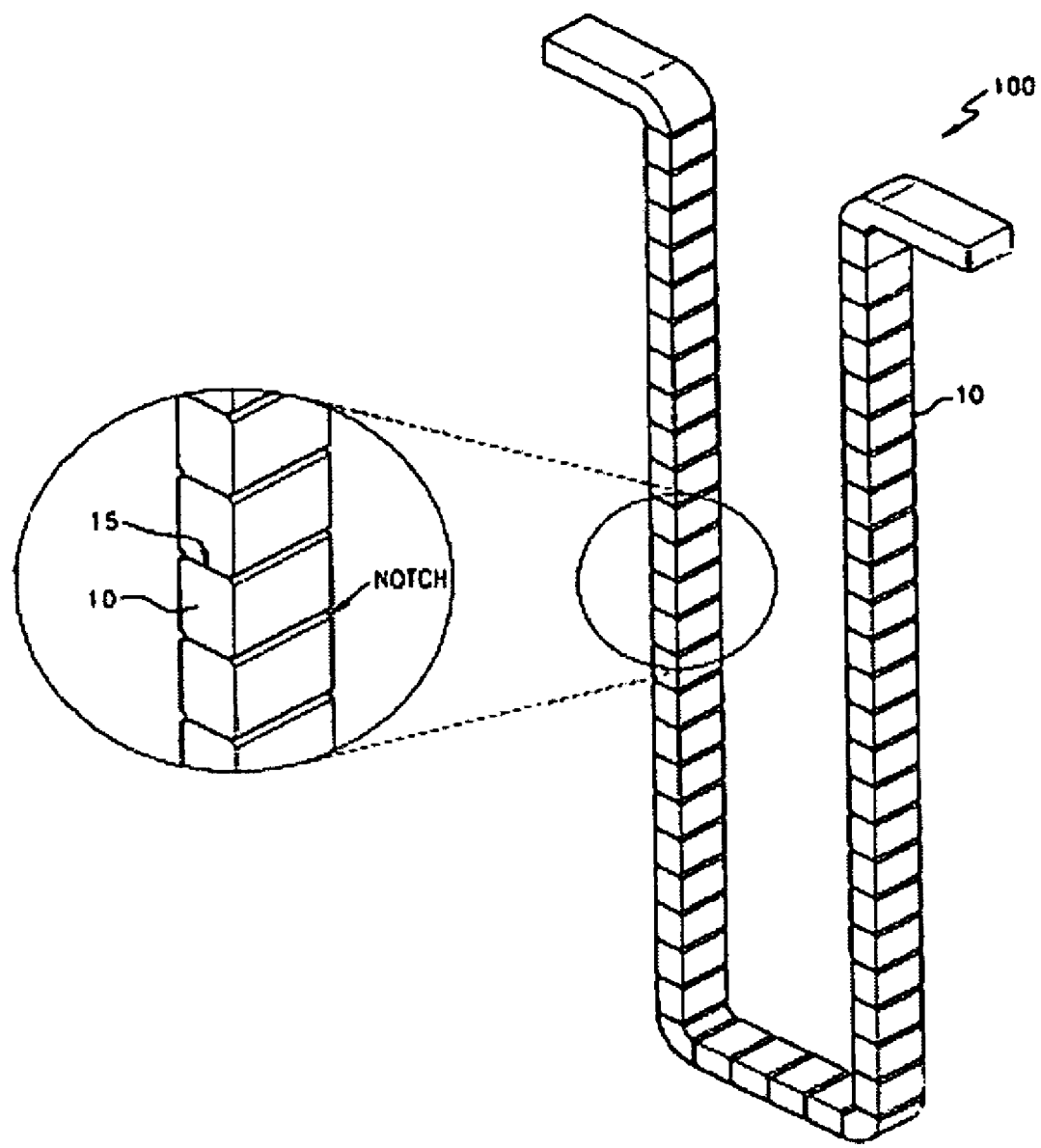
FIG. 1 is a perspective view illustrating a U shaped magnetic wire according to a related art.
Figure 2:
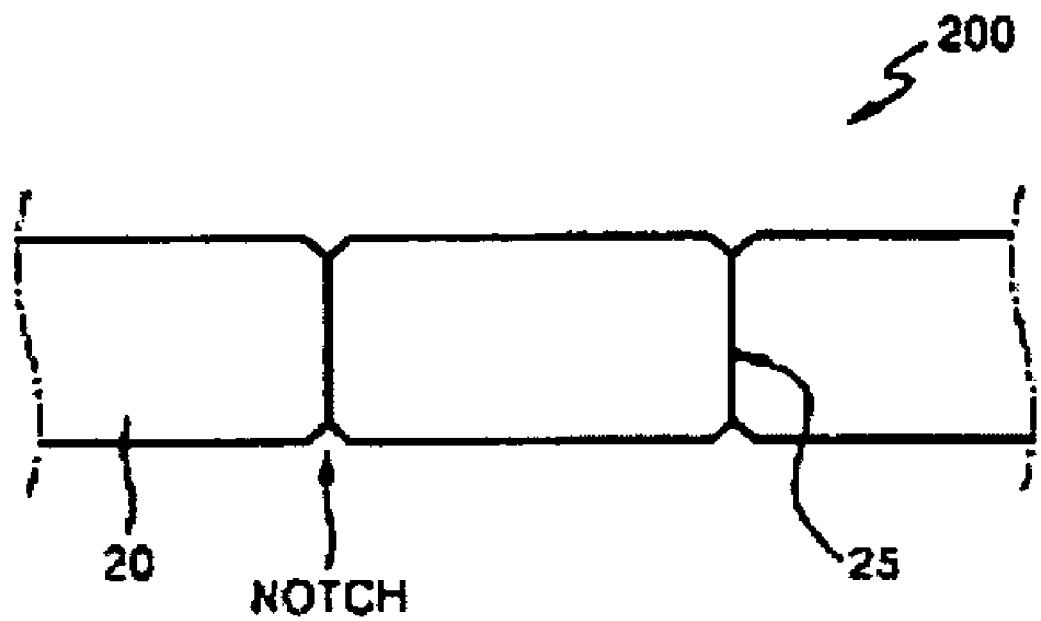
FIG. 2 is a plan view illustrating a magnetic wire according to another related art.
Figure 5A:
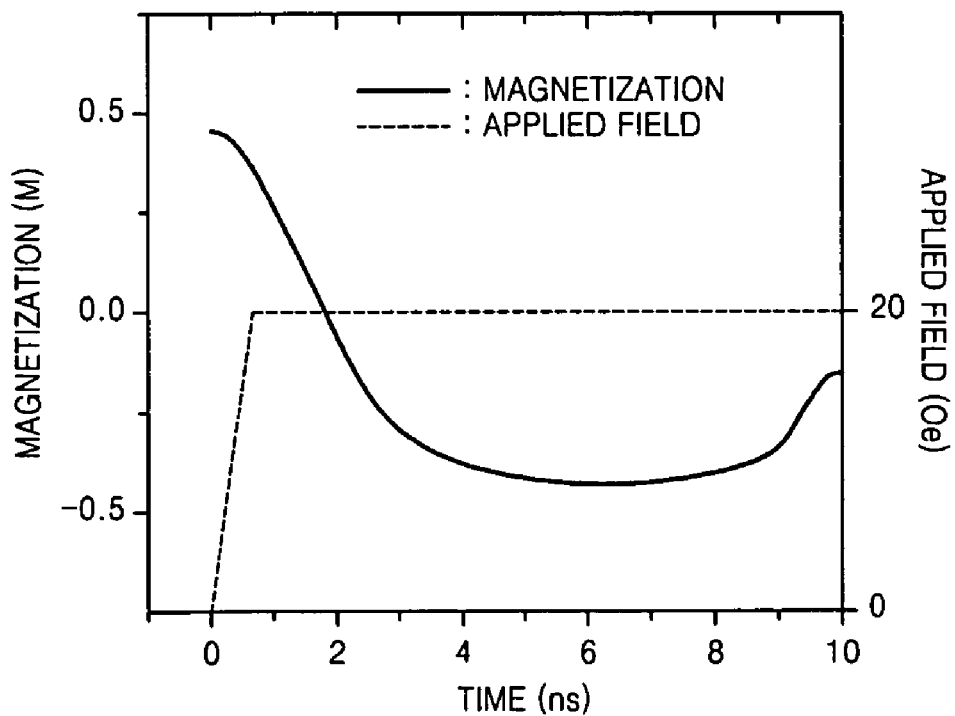
FIG. 5A is an M-T graph showing magnetization characteristics of magnetic substance samples when a continuous field is applied.
Figure 5B:
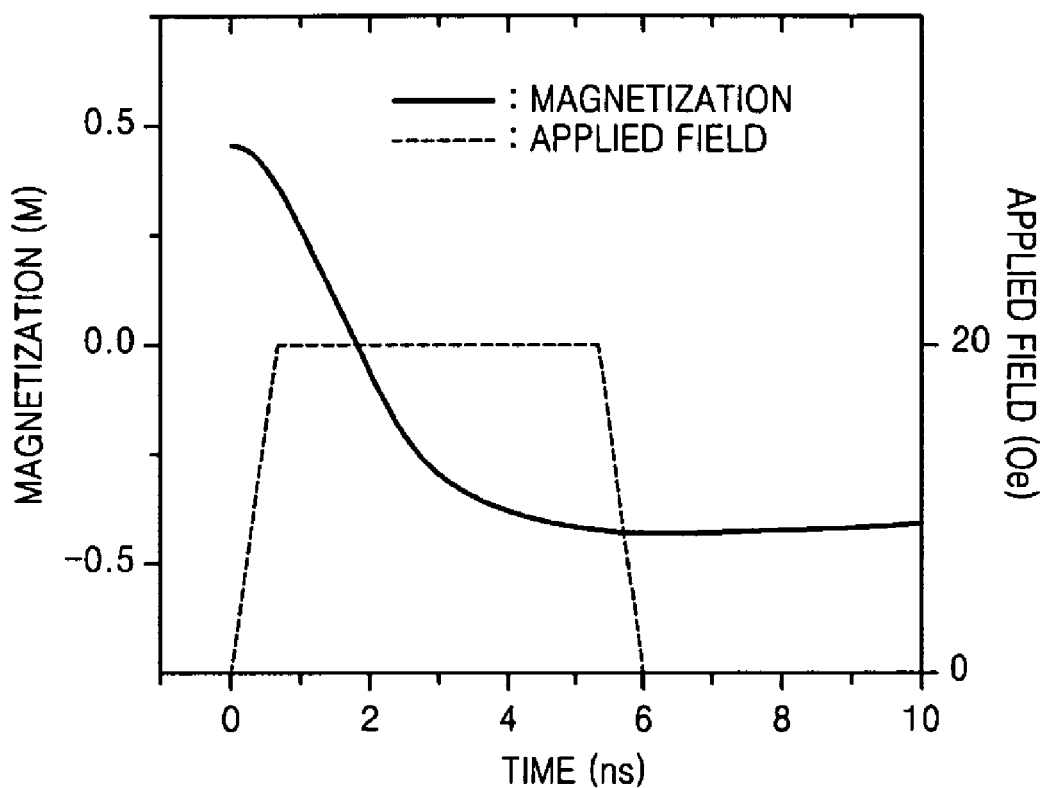
FIG. 5B is an M-T graph showing magnetization characteristics of magnetic substance samples when a pulse field is applied.

FIGS. 5A and 5B are M-T graphs respectively showing magnetization characteristics of magnetic substance samples when a continuous field and a pulse field are applied. The magnetic substance samples used in this experiment are the same magnetic substance samples used for the experiment of FIG. 1. The intensity of the continuous field and the pulse field was 20 Oe. The off-state of the pulse field is around 6 ns which corresponds to the second step.

Referring to FIG. 5B, when the pulse field is applied, it is confirmed that the magnetic moment value M per unit volume remains constant after the second step. This shows that the magnetic domain wall can stably stop moving at the second step by the application of the pulse field. At this time, the moving distance of the magnetic domain wall by a application of the pulse field corresponds to a length of 1 bit. Meanwhile, as in FIG. 5A, when a continuous field is applied like in the prior art, as described above, the third step is performed.

Therefore, when the principle of the present embodiment is used, the magnetic domain wall can be stably stopped without artificially forming notches. Accordingly, if the principle of the present embodiment is applied, a semiconductor device to which magnetic domain wall movement is applied, having high reliability, can be manufactured without the difficulty of forming notches.

Figure 6:
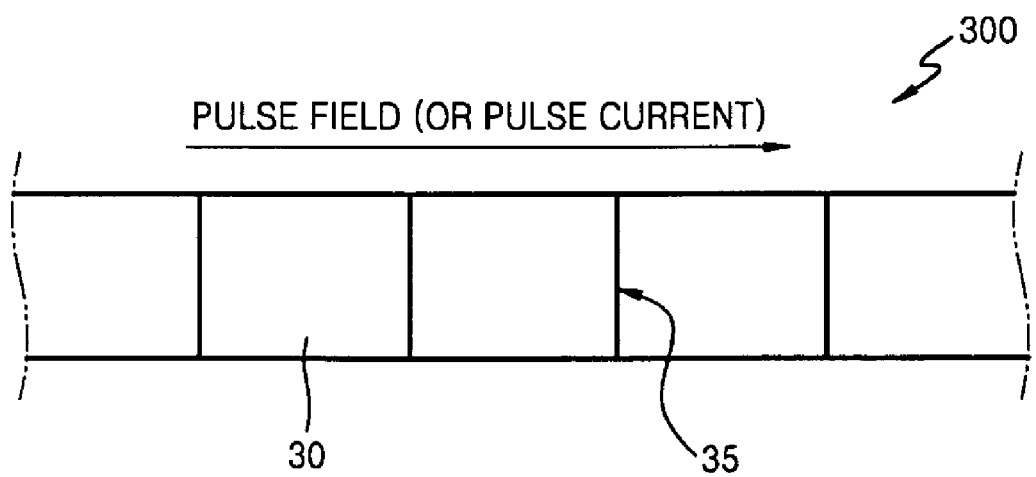
FIG. 6 is a plan view illustrating a semiconductor device to which magnetic domain wall movement is applied according to an exemplary embodiment of the present invention.

FIG. 6 is a plan view illustrating a semiconductor device to which magnetic domain wall movement is applied according to an exemplary embodiment of the present invention.

Referring to FIG. 6, a semiconductor device to which magnetic domain wall movement is applied includes a magnetic wire 300 having a plurality of magnetic domains 30. Here, the magnetic wire 300 is a notch-free wire, and a magnetic domain wall 35 is moved by one of a continuous field and a pulse field.

The intensity of the pulse field can be as strong as the intensity of a continuous field that can periodically oscillate and move the magnetic domain wall, that is, the intensity of the pulse field can be 15-200 Oe. The pulse field has a 'ON' time corresponding to 40 to 80% of the magnetic domain wall oscillation period. In FIG. 5, the 'ON' time of the pulse field can be 4 to 8 ns.

If the magnetic domain wall is moved by a pulse current, the intensity of the pulse current is as strong as the intensity of a continuous current that oscillates the magnetic domain wall. The intensity of the pulse current can be $1.5 \times 10^7$ to $2.0 \times 10^{10}$ A/cm. This value corresponds to the intensity of the pulse field. The pulse current also has an 'ON' time corresponding to 40 to 80% of the magnetic domain wall oscillation period, similar to the pulse field.

The magnetic wire can be formed of one selected from the group consisting of Ni—Fe, Co, Co—Ni, Co—Fe, and Co—Fe—Ni. The width W, thickness, and the damping constant of the magnetic wire can be 5 to 100 nm, 5 to 50 nm, and 0.001 to 0.1, respectively.

In this way, a semiconductor device, which includes a magnetic wire in which the stability of the movement of a magnetic domain wall is ensured without notches by moving the magnetic domain wall using a pulse field or a pulse current, can be manufactured.

As described above, according to the present invention, the magnetic domain wall of a magnetic wire can be precisely moved by a unit of 1 bit without notches by moving the magnetic domain wall using a pulse field (or a pulse current) having an 'ON' time corresponding to 40 to 80% of oscillation period of the magnetic domain wall.

Therefore, according to the present invention, a magnetic domain wall moving semiconductor device having high reliability can be realized without the difficulty of forming notches during manufacturing, and without the problems of reducing the uniformity of characteristics of the device.

In particular, considering that the formation of notches is practically difficult and the ensuring of uniformity is also difficult, the present invention provides a great advantage in terms of mass production and ensuring reproducibility of semiconductor devices to which magnetic domain wall movement is applied.

While this invention has been particularly shown and described with reference to exemplary embodiments thereof, it will be understood by those of ordinary skill in the art that various changes in form and details may be made therein without departing from the spirit and scope of the invention as defined by the appended claims. The semiconductor device can be a storage device such as a HDD that further includes a read/write head, a memory device such as a RAM that further includes read/write electrodes, or a logic device. In some cases, a constituent element added to the storage device, the memory device, and the logic device can differ from those described herein. Therefore, the scope of the invention is defined not by the detailed description of the invention but by the appended claims.

What is claimed is:

1. A semiconductor device that comprises a magnetic wire having a plurality of magnetic domains,
wherein the magnetic wire comprises a magnetic domain wall that is moved by one of a pulse field and a pulse current, the magnetic wire being a notch-free magnetic wire formed of a same material, and the moving distance of the magnetic domain wall is controlled by an intensity and an 'ON' time of the pulse field or the pulse current,
wherein the magnetic domain wall does not move during the 'OFF' time of the pulse field or the pulse current.

2. The semiconductor device of claim 1, wherein the pulse field has an intensity of 15 to 200 Oe.

3. The semiconductor device of claim 1, wherein the pulse field has an intensity as strong as the intensity of a continuous field that periodically oscillates and moves the magnetic domain wall.

4. The semiconductor device of claim 3, wherein the pulse field has an 'ON' time corresponding to 40 to 80% of the magnetic domain wall oscillation period.

5. The semiconductor device of claim 1, wherein the pulse current has an intensity of $1.5 \times 10^7$ to $2.0 \times 10^{10}$ A/cm.

6. The semiconductor device of claim 1, wherein the pulse current has a magnetic intensity as strong as the intensity of a continuous current that periodically oscillates and moves the magnetic domain wall.

7. The semiconductor device of claim 6, wherein the pulse current has an 'ON' time corresponding to 40 to 80% of the magnetic domain wall oscillation period.

8. The semiconductor device of claim 1, wherein the magnetic wire has a width of 5 to 100 nm.

9. The semiconductor device of claim 1, wherein the magnetic wire has a thickness of 5 to 50 nm.

10. The semiconductor device of claim 1, wherein the magnetic wire has a damping constant of 0.001 to 0.1.

11. The semiconductor device of claim 1, wherein the magnetic wire is formed of one selected from the group consisting of Ni—Fe, Co, Co—Ni, Co—Fe, and Co—Fe—Ni.

12. A semiconductor device that comprises a magnetic wire having a plurality of magnetic domains,
wherein the magnetic wire comprises a magnetic domain wall that is moved by one of a pulse field and a pulse current, the magnetic wire being a notch-free magnetic wire, and the moving distance of the magnetic domain wall is controlled by an intensity and an 'ON' time of the pulse field or the pulse current,
wherein the magnetic domain wall does not move during the 'OFF' time of the pulse field or the pulse current,
wherein the pulse field has an intensity as strong as the intensity of a continuous field that periodically oscillates and moves the magnetic domain wall, and
wherein the pulse current has a magnetic intensity as strong as the intensity of a continuous current that periodically oscillates and moves the magnetic domain wall.

13. The semiconductor device of claim 12, wherein the pulse field has an intensity of 15 to 200 Oe.

14. The semiconductor device of claim 12, wherein the pulse field has an 'ON' time corresponding to 40 to 80% of the magnetic domain wall oscillation period.

15. The semiconductor device of claim 12, wherein the pulse current has an intensity of $1.5 \times 10^7$ to $2.0 \times 10^{10}$ A/cm.

16. The semiconductor device of claim 12, wherein the pulse current has an 'ON' time corresponding to 40 to 80% of the magnetic domain wall oscillation period.

17. The semiconductor device of claim 12, wherein the magnetic wire has a width of 5 to 100 nm.

18. The semiconductor device of claim 12, wherein the magnetic wire has a thickness of 5 to 50 nm.

19. The semiconductor device of claim 12, wherein the magnetic wire has a damping constant of 0.001 to 0.1.

20. The semiconductor device of claim 12, wherein the magnetic wire is formed of one selected from the group consisting of Ni—Fe, Co, Co—Ni, Co—Fe, and Co—Fe—Ni.

* * * * *